United States Patent
Lin et al.

(10) Patent No.: US 8,716,705 B2
(45) Date of Patent: May 6, 2014

(54) ORGANIC LIGHT EMITTING DIODE MODULE

(71) Applicant: AU Optronics Corporation, Hsin-Chu (TW)

(72) Inventors: Chen-Chi Lin, Hsin-Chu (TW); Chih-Yi Hung, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 13/716,279

(22) Filed: Dec. 17, 2012

(65) Prior Publication Data
US 2014/0048777 A1    Feb. 20, 2014

(30) Foreign Application Priority Data

Aug. 15, 2012 (TW) ................. 101129563 A

(51) Int. Cl.
*H01L 51/00* (2006.01)
*H01L 51/52* (2006.01)
*H01J 1/62* (2006.01)
*H01L 27/32* (2006.01)

(52) U.S. Cl.
CPC ............. *H01L 51/5203* (2013.01); *H01L 27/32* (2013.01)
USPC ........................................... 257/40; 313/506

(58) Field of Classification Search
CPC . H01L 27/32; H01L 27/3225; H01L 27/3228; H01L 51/5203; H01L 51/5212; H01L 51/5276
USPC ............. 257/40, E51.001, E51.018; 313/506, 313/483, 498
See application file for complete search history.

(56) References Cited

U.S. PATENT DOCUMENTS

| | | | |
|---|---|---|---|
| 7,659,665 B2* | 2/2010 | Young et al. | 313/506 |
| 2005/0023970 A1* | 2/2005 | Maeda et al. | 313/506 |
| 2012/0007134 A1* | 1/2012 | Miyai et al. | 257/99 |

FOREIGN PATENT DOCUMENTS

| | | |
|---|---|---|
| TW | 558916 | 10/2003 |
| TW | 200612169 | 4/2006 |

OTHER PUBLICATIONS

IPC-TM-650, Test Method Manual, pp. 1-3, Aug. 1976.*

* cited by examiner

*Primary Examiner* — Nikolay Yushin
(74) *Attorney, Agent, or Firm* — WPAT, PC; Justin King

(57) ABSTRACT

An organic light emitting diode module is provided and includes a substrate, a first electrode located on the substrate, a pair of second electrodes located on the substrate, a light emitting element located on the substrate, a first copper foil electrically connected to the first electrode, a pair of second copper foils respectively electrically connected to the second electrodes, and a cross connection conductor electrically connected to the second copper foils. The second electrodes are in an arrangement opposite to one another. The light emitting element includes a first electrode layer electrically connected to the first electrode, a second electrode layer located between the second electrodes and electrically connected to the second electrodes, and an organic light emitting layer located between the first and second electrode layers.

17 Claims, 12 Drawing Sheets

ORGANIC LIGHT EMITTING DIODE MODULE

RELATED APPLICATIONS

This application claims priority to Taiwan Application Serial Number 101129563, filed Aug. 15, 2012, which is herein incorporated by reference.

BACKGROUND

1. Technical Field

The present disclosure relates to a light emitting device, and more particularly to an organic light emitting diode module.

2. Description of Related Art

An organic light emitting diode (OLED) includes an anode conductive layer, an organic light emitting layer, and a cathode conductive layer. Generally, the anode conductive layer is indium tin oxide (ITO), and the cathode conductive layer is a metal sheet. The organic light emitting layer is located between the anode and cathode conductive layers, such that the organic light emitting diode has a layered structure with the organic light emitting layer sandwiched between the anode and cathode conductive layers. When power is provided to the anode and cathode conductive layers, the organic light emitting layer can emit light. Since the organic light emitting diode is self-emissive, a backlight module does not need to be assembled to the organic light emitting diode, and the organic light emitting diode has wider viewing angles and better brightness compared with a liquid crystal display panel. Moreover, the organic light emitting diode has a low driving voltage, and is further associated with the advantages of fast reaction, light weight, a thin profile, low energy consumption, simple structure, and reduced cost. Therefore, organic light emitting diode modules are used in the screens of various consumer electronic products (e.g., cellular phones and tablet computers).

In order to achieve uniform brightness in a conventional organic light emitting diode module, four electrodes are often respectively arranged on four sides of a substrate of the organic light emitting diode module during the manufacturing process. Two opposite electrodes from among the four electrodes are electrically connected to the anode conductive layer of the OLED module, and the other two opposite electrodes from among the four electrodes are electrically connected to the cathode conductive layer of the OLED module. Four flexible printed circuit boards (FPC) are respectively connected to the four electrodes, and each of the flexible printed circuit boards has a connector to connect to a power supply through a conductive wire.

However, the cost of the flexible printed circuit board is high, and the thickness of the connector is significant (more than 2.5 mm). The thickness of the connector is such that the thickness of the whole organic light emitting diode module is not easily reduced. Furthermore, the conventional organic light emitting diode module needs the four conductive wires to connect to the four flexible printed circuit boards, such that the cost of assembling the organic light emitting diode module is increased.

SUMMARY

An aspect of the present invention is to provide an organic light emitting diode module.

In an embodiment of the present invention, an organic light emitting diode module includes a substrate, a first electrode, a pair of second electrodes, a light emitting element, a first copper foil, a pair of second copper foils, and a cross connection conductor. The first electrode is located on the substrate. The second electrodes are located on the substrate, and are in an arrangement opposite to one another. The light emitting element is located on the substrate and includes a first electrode layer, a second electrode layer, and an organic light emitting layer. The first electrode layer is electrically connected to the first electrode. The second electrode layer is located between the second electrodes, and is electrically connected to the second electrodes. The organic light emitting layer is located between the first and second electrode layers. The first copper foil is electrically connected to the first electrode. The second copper foils are respectively electrically connected to the second electrodes. The cross connection conductor is electrically connected to the second copper foils.

In an embodiment of the present invention, the cross connection conductor is a third copper foil.

In an embodiment of the present invention, the third copper foil and the second copper foils form a U-shaped configuration when viewed from above.

In an embodiment of the present invention, the third copper foil and the second copper foils are formed as a single piece.

In an embodiment of the present invention, the organic light emitting diode module further includes at least one conductive adhesive. The conductive adhesive adheres the third copper foil and the second copper foils.

In an embodiment of the present invention, the third copper foil includes two opposite end portions along the length direction thereof. Each of the second copper foils includes a connecting portion adjacent to the third copper foil. The two opposite end portions of the third copper foil respectively overlap the connecting portions of the second copper foils.

In an embodiment of the present invention, the organic light emitting diode module further includes at least one conductive adhesive. The conductive adhesive adheres the two opposite end portions of the third copper foil and the connecting portions of the second copper foils.

In an embodiment of the present invention, the cross connection conductor is a conductive wire.

In an embodiment of the present invention, the organic light emitting diode module further includes a third electrode. The third electrode is located on the substrate, and is opposite to the first electrode. The first electrode layer is located between the first and third electrodes, and is electrically connected to the first and third electrodes.

In an embodiment of the present invention, the cross connection conductor is disposed above the third electrode overlapping at least a portion of the third electrode.

In an embodiment of the present invention, the organic light emitting diode module further includes an insulating layer. The insulating layer is located between the third electrode and the cross connection conductor.

In an embodiment of the present invention, the organic light emitting diode module further includes a power supply. The power supply provides a negative potential to the first copper foil and provides a positive potential to the second copper foils.

In an embodiment of the present invention, the organic light emitting diode module further includes a first conductive wire and at least one second conductive wire. The first conductive wire is electrically connected to the first copper foil. The second conductive wire is electrically connected to at least one of the second copper foils and the cross connection conductor.

In an embodiment of the present invention, a volume conductivity of the first copper is larger than $100 \times 10^{-6}$ Ohm·cm.

In an embodiment of the present invention, a volume conductivity of each of the second copper foils is larger than $100 \times 10^{-6}$ Ohm·cm.

In an embodiment of the present invention, the thickness of each of the second copper foils is smaller than 0.5 mm.

In an embodiment of the present invention, the organic light emitting diode module further includes a protection cover. The protection cover is located on the first and the second electrodes.

In an embodiment of the present invention, the organic light emitting diode module further includes a packaging gel. The packaging gel adheres the protection cover on the first and the second electrodes.

In the aforementioned embodiments of the present invention, since the cross connection conductor of the organic light emitting diode module is electrically connected to the second copper foils, an end of a conductive wire can be selectively electrically connected to one of the cross connection conductor and the second copper foils, and another end of the conductive wire is electrically connected to an anode of the power supply, such that the power supply can provide the positive potential to the second copper foils at the same time. Moreover, two ends of another conductive wire can be connected respectively to the first copper foil and a cathode of the power supply, such that the power supply can provide the negative potential to the first copper foil. As a result, the organic light emitting diode module in the aforementioned embodiments can have uniform brightness by only the two conductive wires connected to the power supply, and the cost of the copper foils is cheaper than the cost of conventional flexible printed circuit boards, such that the material cost and the assembly cost of the organic light emitting diode module can be reduced. Furthermore, the copper foils can be connected to the conductive wires without any connectors (e.g., by soldering), such that the thickness of the organic light emitting diode module can be decreased.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
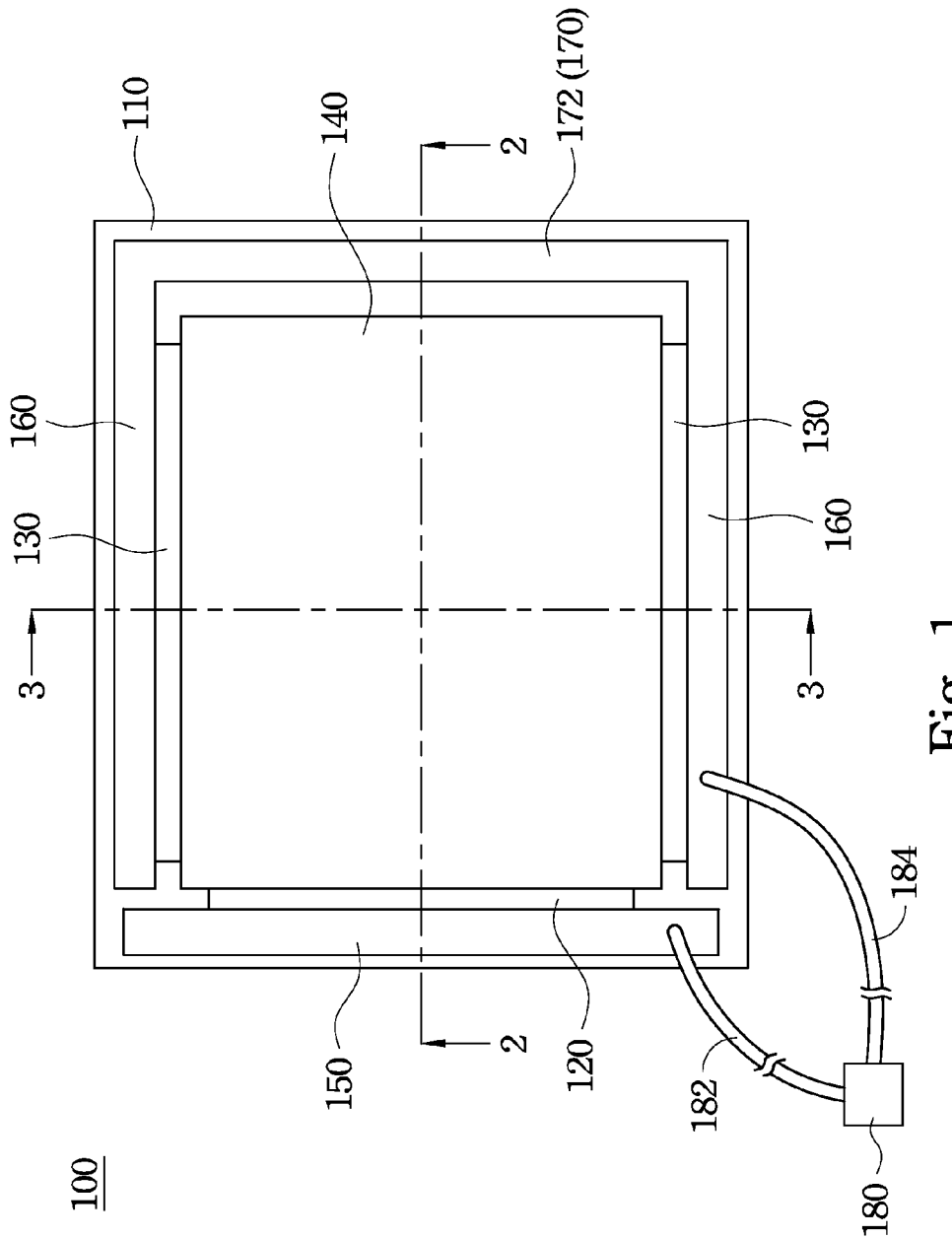
FIG. 1 is a top view of an organic light emitting diode module according to an embodiment of the present invention.

FIG. 1 is a top view of an organic light emitting diode module 100 according to an embodiment of the present invention. As shown in FIG. 1, the organic light emitting diode module 100 includes a substrate 110, a first electrode 120, a pair of second electrodes 130, a light emitting element 140, a first copper foil 150, a pair of second copper foils 160, and a cross connection conductor 170. The first and second electrodes 120, 130 and the light emitting element 140 are located on the substrate 110, and the second electrodes 130 are in an arrangement opposite to one another. The cross connection conductor 170 is electrically connected to the second copper foils 160.

Moreover, the organic light emitting diode module 100 may further include a power supply 180, a first conductive wire 182, and a second conductive wire 184. An end of the first conductive wire 182 can be electrically connected to the first copper foil 150 by soldering, and another end of the first conductive wire 182 is electrically connected to a cathode of the power supply 180. An end of the second conductive wire 184 may be electrically connected to at least one of the second copper foils 160 and the cross connection conductor 170 by soldering, and another end of the second conductive wire 184 is electrically connected to an anode of the power supply 180. As a result, the power supply 180 can provide a negative potential to the first copper foil 150, and a positive potential to the second copper foils 160.

In this embodiment, the first electrode 120 is a cathode, and the second electrodes 130 are anodes. The cross connection conductor 170 is a third copper foil 172. Furthermore, the third copper foil 172 and the second copper foils 160 form a U-shaped configuration when viewed from above, and the third copper foil 172 and the second copper foils 160 are formed as a single piece. However, in other embodiments (to be described hereinafter), each of the third copper foil 172 and the second copper foils 160 may also be a strip-shaped copper foil, and the three strip-shaped copper foils are connected with each other. The cross connection conductor 170 may be other types of conductive elements, such as a conductive wire, and the cross connection conductor 170 should not be limited to a specific type of conductive element.

It is to be noted that in a portion of the following description associated with FIG. 2 to FIG. 8, the cross connection conductor 170 will be described as the third copper foil 172.

Figure 2:
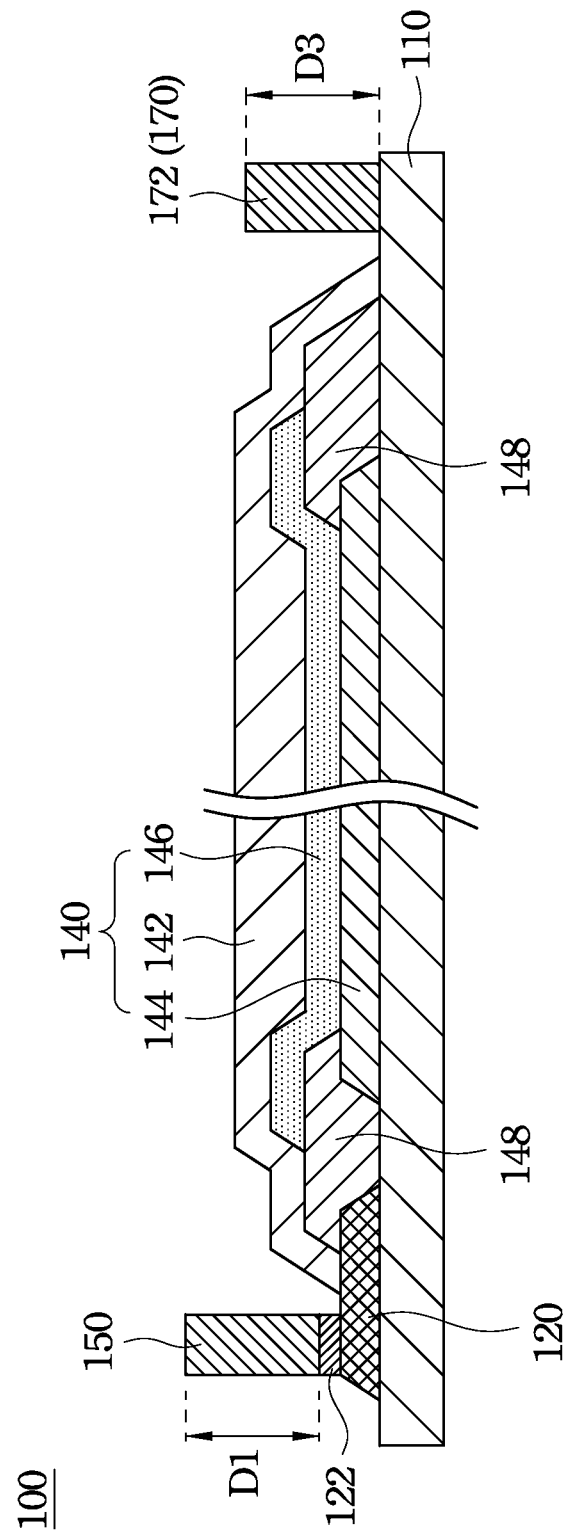
FIG. 2 is a cross-sectional view of the organic light emitting diode module taken along line 2-2 shown in FIG. 1.
Figure 3:
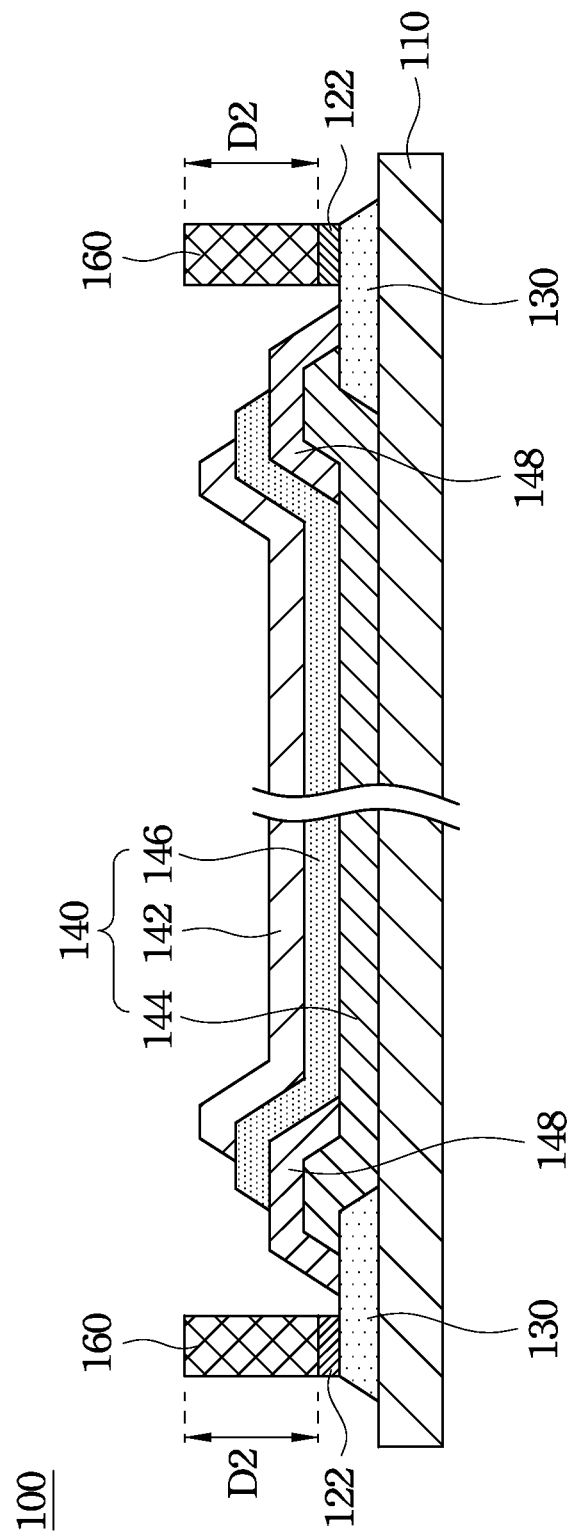
FIG. 3 is a cross-sectional view of the organic light emitting diode module taken along line 3-3 shown in FIG. 1.

FIG. 2 is a cross-sectional view of the organic light emitting diode module 100 taken along line 2-2 shown in FIG. 1. FIG. 3 is a cross-sectional view of the organic light emitting diode module 100 taken along line 3-3 shown in FIG. 1. As shown in FIG. 2 and FIG. 3, the light emitting element 140 includes a first electrode layer 142, a second electrode layer 144, and an organic light emitting layer 146. The first electrode layer 142 is electrically connected to the first electrode 120. The second electrode layer 144 is located between the second electrodes 130, and is electrically connected to the second electrodes 130. The first copper foil 150 is electrically connected to the first electrode 120. The second copper foils 160 are respectively electrically connected to the second electrodes 130. The organic light emitting layer 146 is located between the first and second electrode layers 142, 144. The third copper foil 172 is located on the substrate 110, but is not in electrical contact with the first electrode layer 142. A conductive adhesive 122 may be used to adhere the first copper foil 150 on the first electrode 120, and also to adhere the second copper foils 160 respectively on the second electrodes 130. The conductive adhesive 122 may be an adhesive including conductive elements, such as gold, silver, nickel, tin, or combinations thereof. Moreover, the light emitting element 140 may further include a protection layer 148 to insulate the first and second electrode layers 142, 144. The protection layer 148 may be made of a material that includes oxides or nitrides.

In this embodiment, the substrate 110 may be a light transmissive glass substrate. A thickness D1 of the first copper foil 150, a thickness D2 of each of the second copper foils 160, and a thickness D3 of the third copper foil 172 are all smaller than 0.5 mm (e.g., 0.1 mm), and a volume conductivity of each of the first, second, and third copper foils 150, 160, 172 is larger than $100 \times 10^{-6}$ Ohm·cm, but these parameters are not limited in this regard. For example, the volume conductivity of each of the first, second, and third copper foils 150, 160, 172 may be in a range from $0.01 \times 10^{-6}$ to $103 \times 10^{-6}$ Ohm·cm. Furthermore, the first electrode layer 142 of the light emitting element 140 may be a metal film, and the second electrode layer 144 may be indium tin oxide (ITO), but the present invention is not limited in this regard.

As shown in FIG. 1 to FIG. 3, in this embodiment, the first electrode layer 142 is connected to the cathode of the power supply 180 by the first electrode 120, the first copper foil 150, and the first conductive wire 182. The second electrode layer 144 is connected to the anode of the power supply 180 by the second electrodes 130, the second copper foils 160, the third copper foil 172, and the second conductive wire 184. When the power supply 180 provides the negative potential to the first copper foil 150 and provides the positive potential to the second copper foils 160, the first electrode layer 142 of the light emitting element 140 can be regarded as a cathode, and the second electrode layer 144 of the light emitting element 140 can be regarded as an anode, such that the organic light emitting layer 146, which includes phosphor and fluorescence materials, is excited to emit light.

Since a resistance of the first electrode layer 142 (e.g., a metal film) is much smaller than a resistance of the second electrode layer 144 (e.g., ITO), in this embodiment, it is necessary only to arrange the first copper foil 150 and the first electrode 120 to the left side of the first electrode layer 142, and by providing the negative potential to the first electrode layer 142 through the first copper foil 150 and the first electrode 120, the organic light emitting diode module 100 can output a sufficient uniform brightness. That is to say, the first electrode layer 142 does not need to have a configuration associated therewith as in the case of the second electrode layer 144, in which the second copper foils 160 and the second electrodes 130 are arranged in a layered configuration on both sides of the second electrode layer 144.

The cross connection conductor 170 of the organic light emitting diode module 100 is electrically connected to the second copper foils 160, such that the power supply 180 can provide the positive potential to the copper foils 160 at the same time by the single second conductive wire 184. The first conductive wire 182 is electrically connected to the first copper foil 150, such that the power supply 180 can provide the negative potential to the first copper foil 150. As a result, the organic light emitting diode module 100 can have uniform brightness by only the two first and second conductive wires 182, 184 connected to the power supply 180, and the cost of the copper foils is cheaper than the cost of conventional flexible printed circuit boards, such that the material cost and the assembly cost of the organic light emitting diode module 100 can be reduced. Furthermore, the copper foils can be connected to the conductive wires without any connectors (e.g., by soldering), such that the thickness of the organic light emitting diode module 100 can be decreased. Moreover, the volume conductivity of the copper foils (e.g., $25 \times 10^{-6}$ Ohm·cm) is larger than the volume conductivity of the conventional flexible printed circuit boards (e.g., $1 \times 10^{-15}$ Ohm·cm). When conducting electricity, the temperature of the copper foils is lower than temperature of the conventional flexible printed circuit boards, such that the life span of the organic light emitting diode module 100 can be extended.

It is to be noted that the connection relationship of the aforementioned elements will not be repeated. In the following description, other elements of the organic light emitting diode module 100 and other types of the cross connection conductor 170 will be described in detail.

Figure 4:
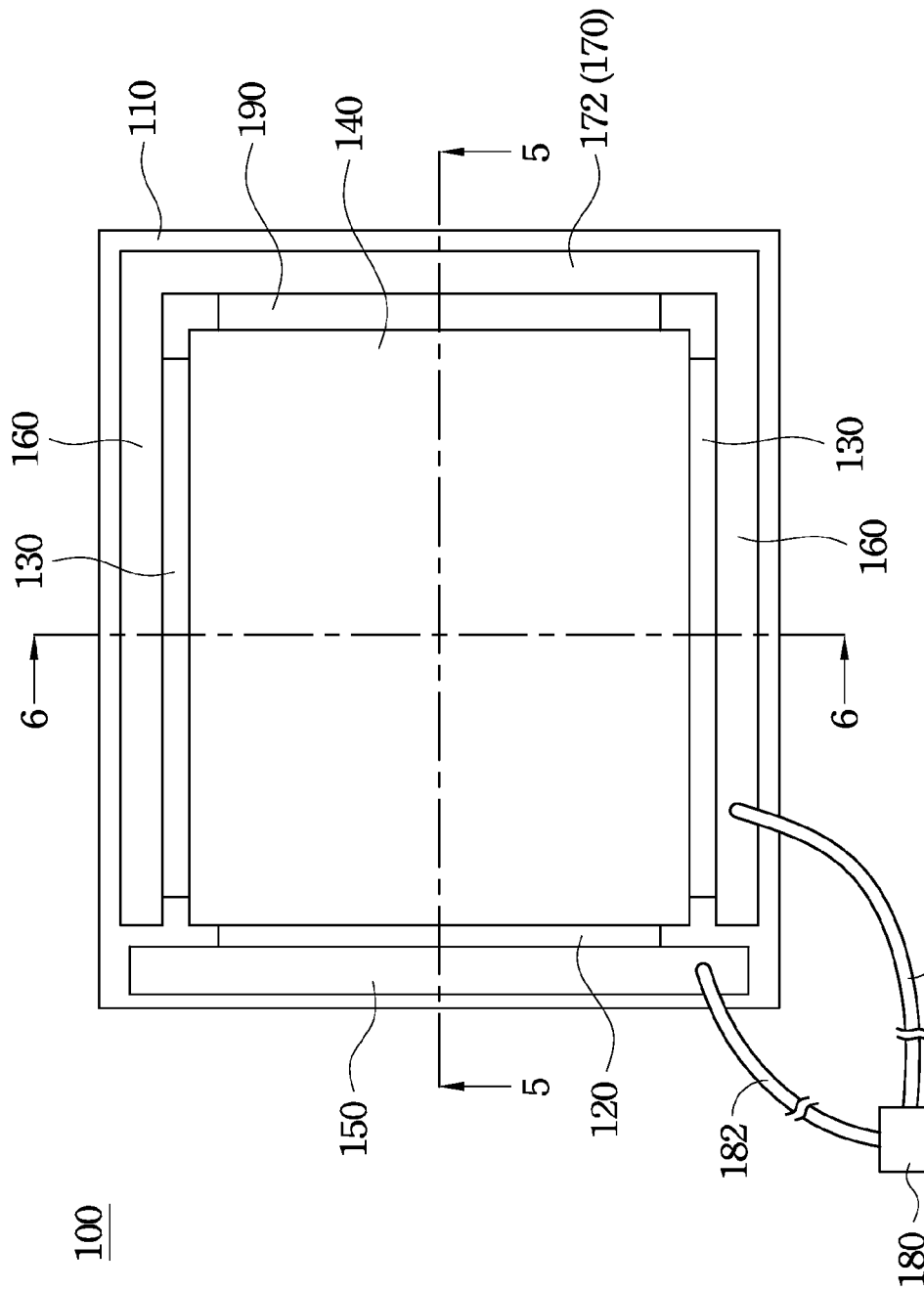
FIG. 4 is a top view of an organic light emitting diode module according to an embodiment of the present invention.

FIG. 4 is a top view of an organic light emitting diode module 100 according to an embodiment of the present invention. The organic light emitting diode module 100 shown in FIG. 4 includes the substrate 110, the first electrode 120, the second electrodes 130, the light emitting element 140, the first copper foil 150, the second copper foils 160, and the cross connection conductor 170. The difference between this embodiment and the embodiment shown in FIG. 1 is that the organic light emitting diode module 100 shown in FIG. 4 further includes a third electrode 190. The third electrode 190 is located on the substrate 110, and is opposite to the first electrode 120. Moreover, the cross connection conductor 170 is disposed above the third electrode 190 overlapping at least a portion of the same, and the cross connection conductor 170 is the third copper foil 172.

Figure 5:
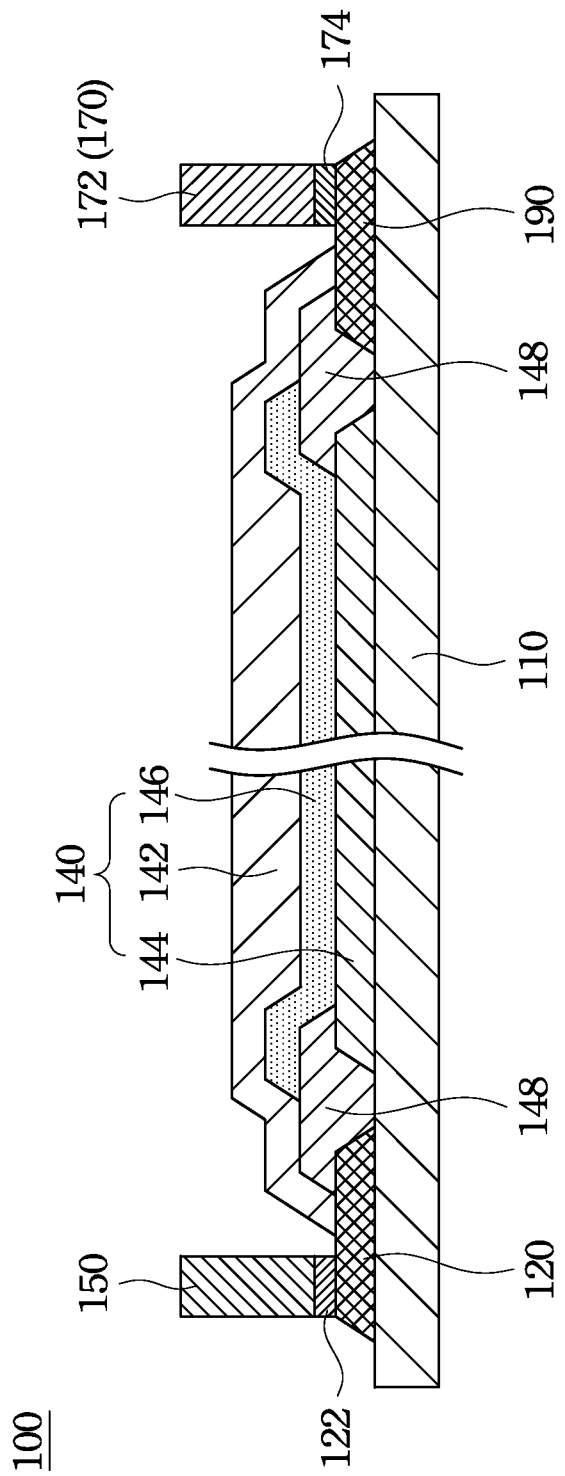
FIG. 5 is a cross-sectional view of the organic light emitting diode module taken along line 5-5 shown in FIG. 4.
Figure 6:
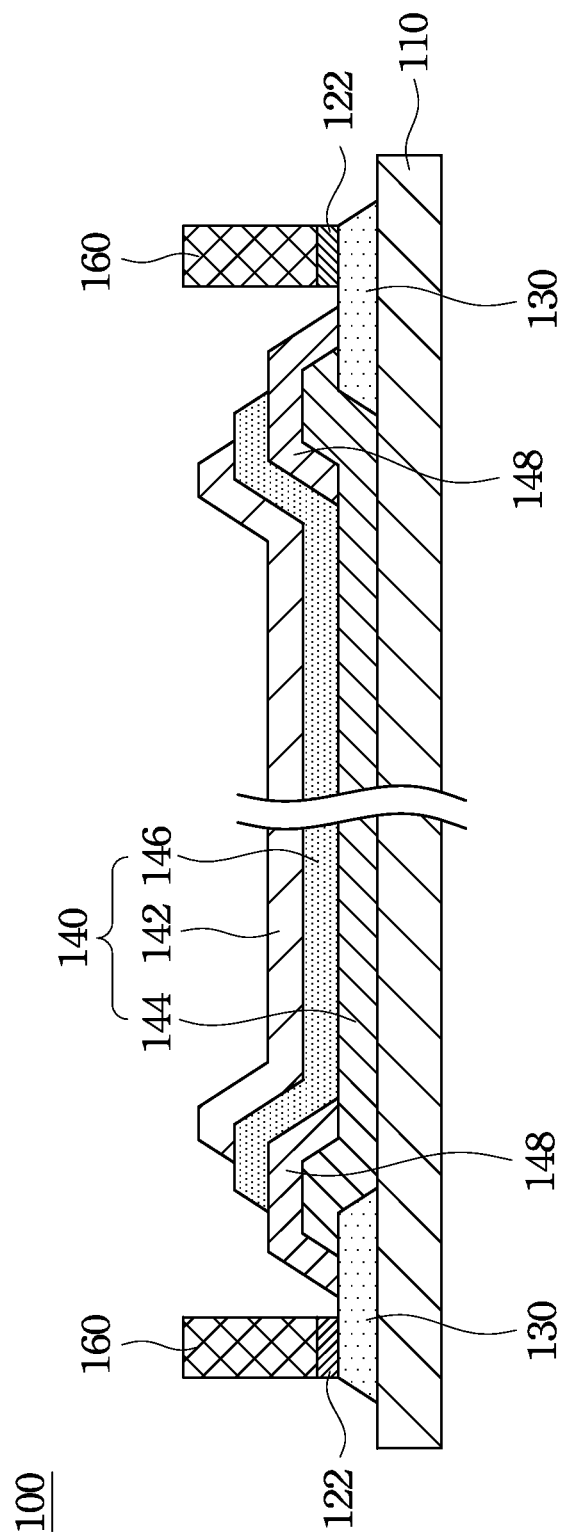
FIG. 6 is a cross-sectional view of the organic light emitting diode module taken along line 6-6 shown in FIG. 4.

FIG. 5 is a cross-sectional view of the organic light emitting diode module 100 taken along line 5-5 shown in FIG. 4. FIG. 6 is a cross-sectional view of the organic light emitting diode module 100 taken along line 6-6 shown in FIG. 4. As shown in FIG. 5 and FIG. 6, the first electrode layer 142 of the light emitting element 140 is located between the first and third electrodes 120, 190, and is electrically connected to the first and third electrodes 120, 190. Furthermore, the first and third electrodes 120, 190 are cathodes, and the second electrodes 130 are anodes. Therefore, the third copper foil 172 cannot be electrically connected to the third electrode 190.

In this embodiment, the organic light emitting diode module 100 includes an insulating layer 174. The insulating layer 174 is located between the third electrode 190 and the third copper foil 172 (i.e., the cross connection conductor 170) to prevent the organic light emitting diode module 100 from shorting caused by the third copper foil 172 electrically contacting with the third electrode 190.

Referring back to FIG. 4, since the organic light emitting diode module 100 includes the opposite first and third electrodes 120, 190, and the opposite second electrodes 130, designers may selectively change the position of the first copper foil 150 and the direction of an opening formed by the second copper foils 160 and the third copper foil 172 in accordance with practical requirements. In this embodiment, the direction of the opening formed by the second copper foils 160 and the third copper foil 172 is toward the left side of the organic light emitting diode module 100. However, in another embodiment, the first copper foil 150 may be located on the third electrode 190 and electrically connected to the third electrode 190. The third copper foil 172 may be located on the first electrode 120 but not electrically connected to the first electrode 120. As a result, the direction of the opening formed by the second copper foils 160 and the third copper foil 172 in such an embodiment is toward the right side of the organic light emitting diode module 100. When the power supply 180 provides the negative potential to the first copper foil 150, and provides the positive potential to the second copper foils 160, the organic light emitting diode module 100 still can work normally.

Figure 7:
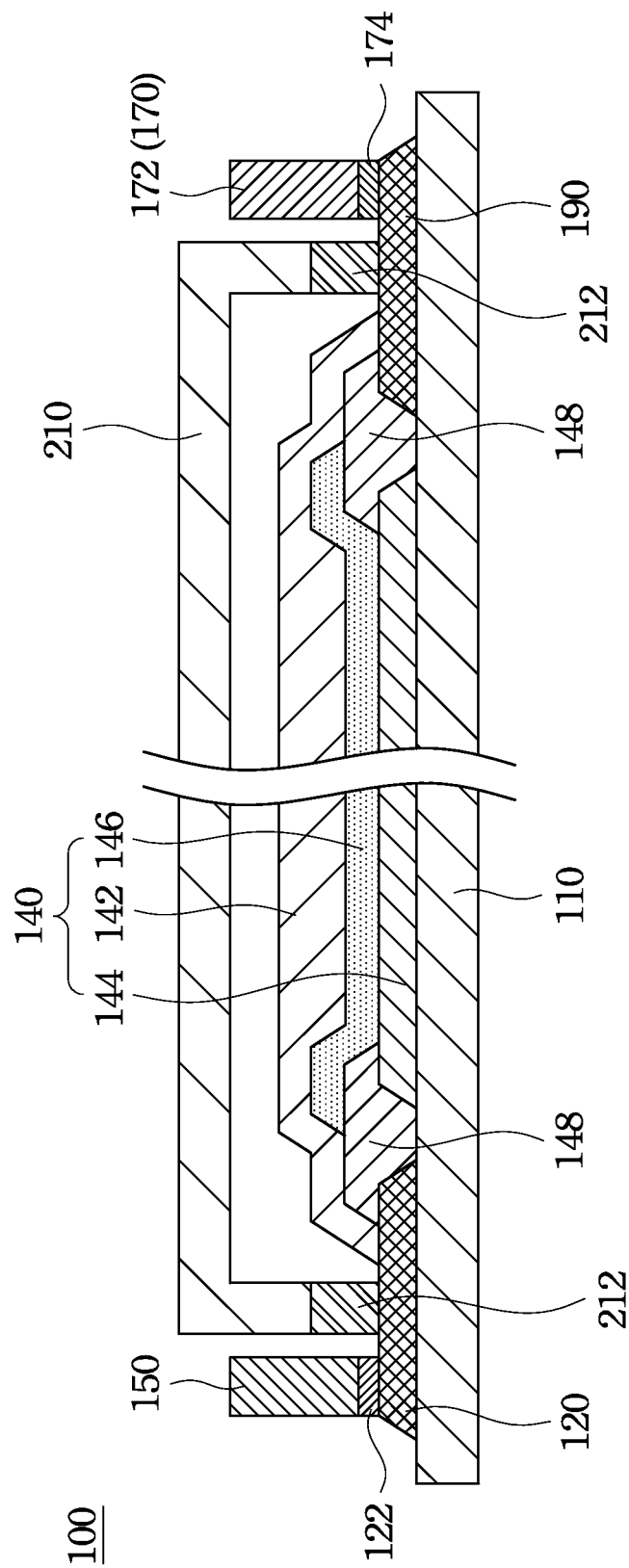
FIG. 7 is a cross-sectional view of an organic light emitting diode module according to an embodiment of the present invention, in which the cross-sectional position is the same as in FIG. 5.
Figure 8:
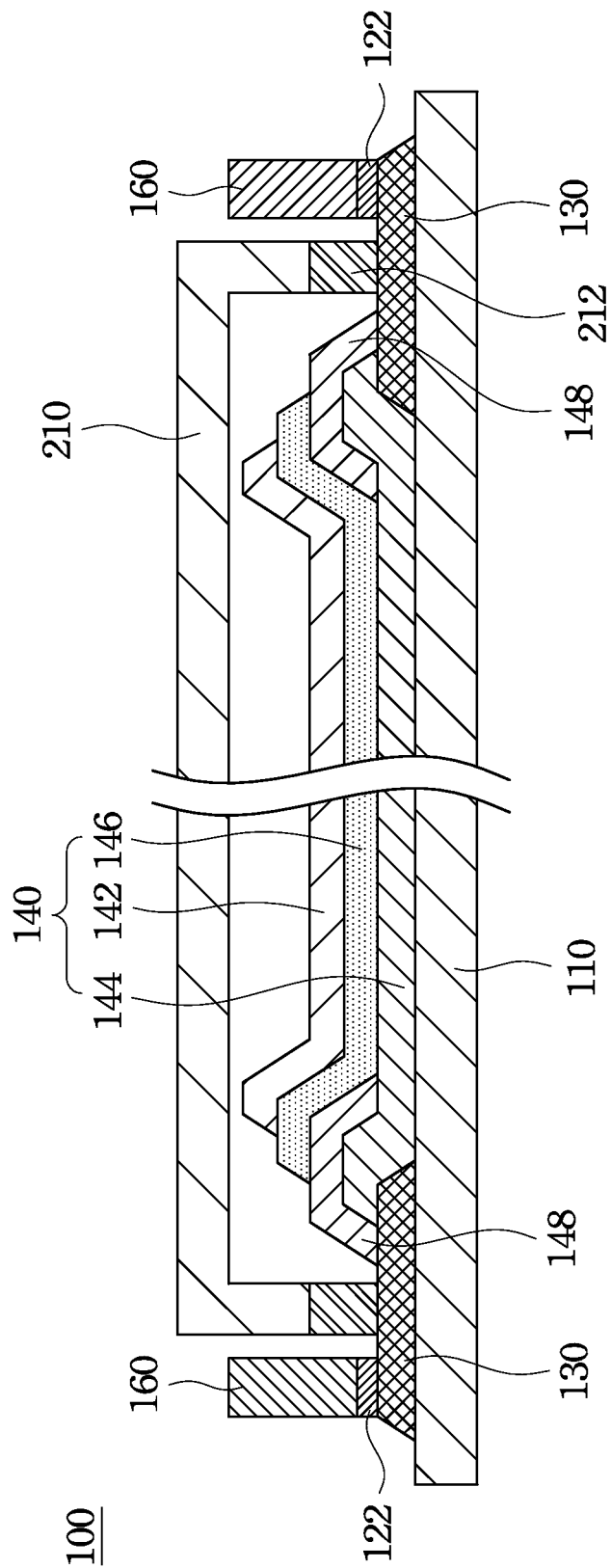
FIG. 8 is another cross-sectional view of the organic light emitting diode module shown in FIG. 7, in which the cross-sectional position is the same as in FIG. 6.

FIG. 7 is a cross-sectional view of an organic light emitting diode module 100 according to an embodiment of the present invention, in which the cross-sectional position is the same as in FIG. 5. FIG. 8 is another cross-sectional view of the organic light emitting diode module 100 shown in FIG. 7, in which the cross-sectional position is the same as in FIG. 6. As shown in FIG. 7 and FIG. 8, the difference between this embodiment and the embodiment shown in FIG. 5 and FIG. 6 is that the organic light emitting diode module 100 may further include a protection cover 210 and a packaging gel 212. The protection cover 210 can be adhered on the first, second, and third electrodes 120, 130, 190 by the packaging gel 212. The protection cover 210 and the packaging gel 212 can protect the light emitting element 140, such that the light emitting element 140 is not exposed to foreign bodies (e.g., dust) and does not suffer damage caused by external forces.

Figure 9:
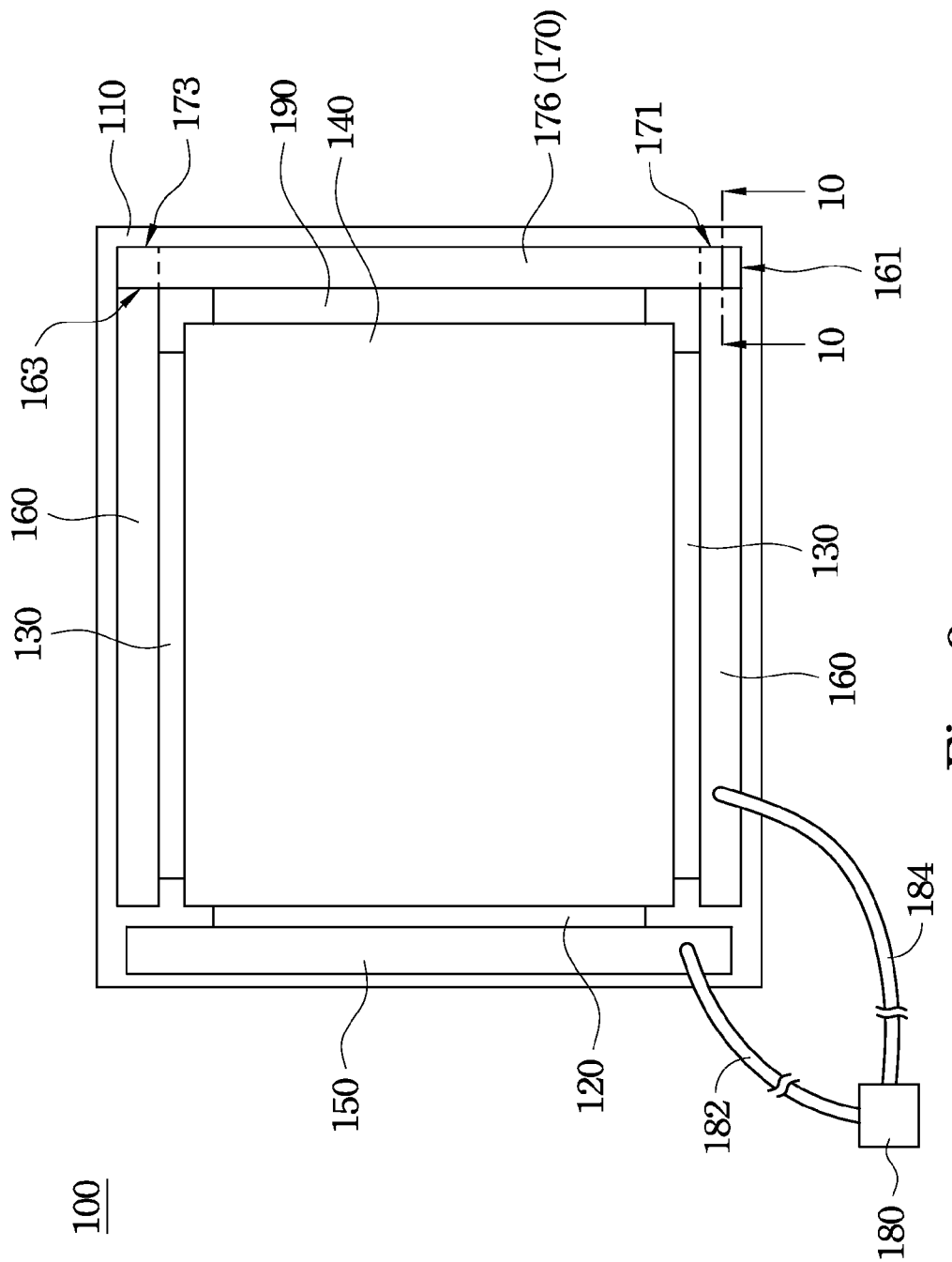
FIG. 9 is a top view of an organic light emitting diode module according to an embodiment of the present invention.
Figure 10:
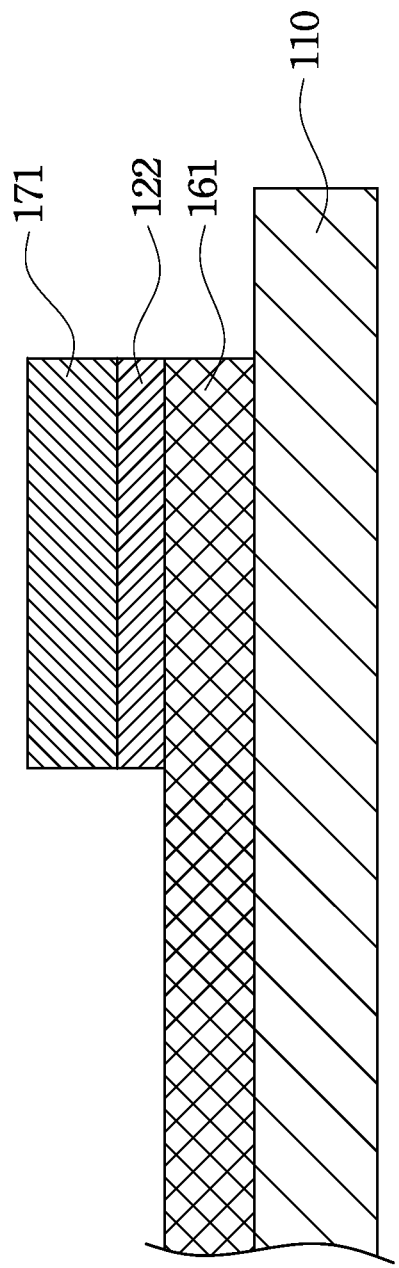
FIG. 10 is a cross-sectional view of the organic light emitting diode module taken along line 10-10 shown in FIG. 9.

FIG. 9 is a top view of an organic light emitting diode module 100 according to an embodiment of the present invention. FIG. 10 is a cross-sectional view of the organic light emitting diode module 100 taken along line 10-10 shown in FIG. 9. As shown in FIG. 9 and FIG. 10, the organic light emitting diode module 100 includes the substrate 110, the first electrode 120, the second electrodes 130, the light emitting element 140, the first copper foil 150, the second copper foils 160, the cross connection conductor 170, and the third electrode 190. The cross connection conductor 170 is a third copper foil 176. The difference between this embodiment and the embodiment shown in FIG. 4 is that each of the third copper foil 176 and the second copper foils 160 in FIG. 9 and FIG. 10 is a strip-shaped copper foil, and the third copper foil 176 and the second copper foils 160 are not integrally formed into a U-shaped copper foil.

The organic light emitting diode module 100 includes the conductive adhesive 122 to adhere the third copper foil 176 and the second copper foils 160, such that the third copper foil 176 can be electrically connected to the second copper foils 160. In this embodiment, the third copper foil 176 includes two opposite end portions 171, 173 along the length direction thereof. One of the second copper foils 160 includes a connecting portion 161 adjacent to the end portion 171 of the third copper foil 176, and the other one of the second copper foils 160 includes a connecting portion 163 adjacent to the end portion 173 of the third copper foil 176. The two opposite end portions 171, 173 of the third copper foil 176 respectively overlap the connecting portions 161, 163 of the second copper foils 160. The conductive adhesive 122 adheres the two opposite end portions 171, 173 of the third copper foil 176 respectively to the connecting portions 161, 163 of the second copper foils 160. FIG. 10 shows a state in which the end portion 171 of the third copper foil 176 is adhered on the connecting portion 161 of one of the second copper foils 160. Since the manner in which the end portion 173 of the third copper foil 176 and the connecting portion 163 of the other one of the second copper foils 160 are adhered to one another is substantially the same as the manner in which the end portion 171 of the third copper foil 176 and the connecting portion 161 of one of the second copper foils 160 are adhered to one another, the figures do not show a state where the end portion 173 of the third copper foil 176 is adhered on the connecting portion 163 of the other one of the second copper foils 160.

Moreover, when the third copper foil 176 is adhered to the second copper foils 160 by the conductive adhesive 122, the end portion 171 of the third copper foil 176 may be adhered on a top surface or a bottom surface of the connecting portion 161 of one of the second copper foils 160, and the end portion 173 of the third copper foil 176 may be adhered on a top surface or a bottom surface of the connecting portion 163 of the other one of the second copper foils 160, and the present invention is not limited in this regard.

Figure 11:
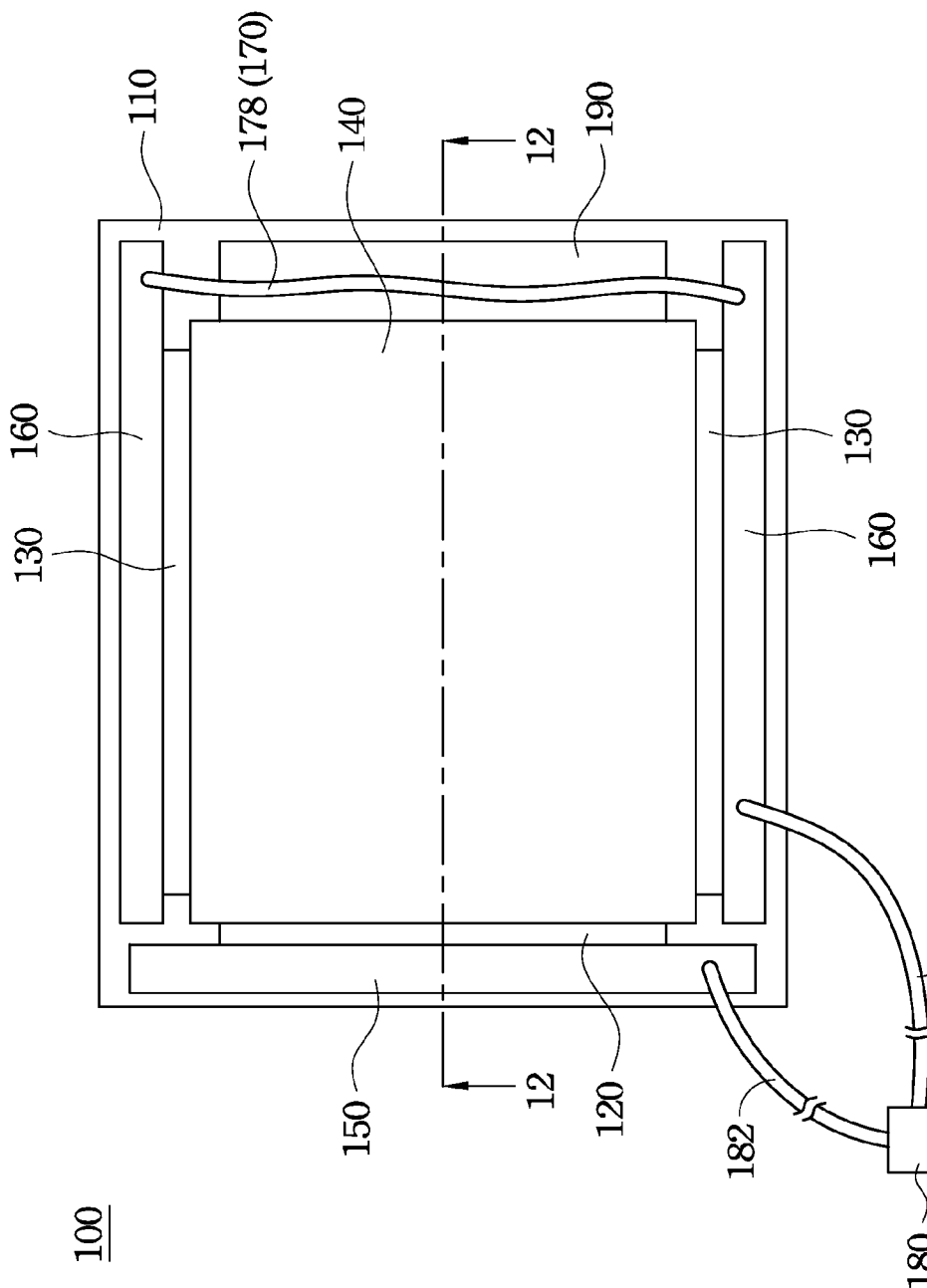
FIG. 11 is a top view of an organic light emitting diode module according to an embodiment of the present invention.
Figure 12:
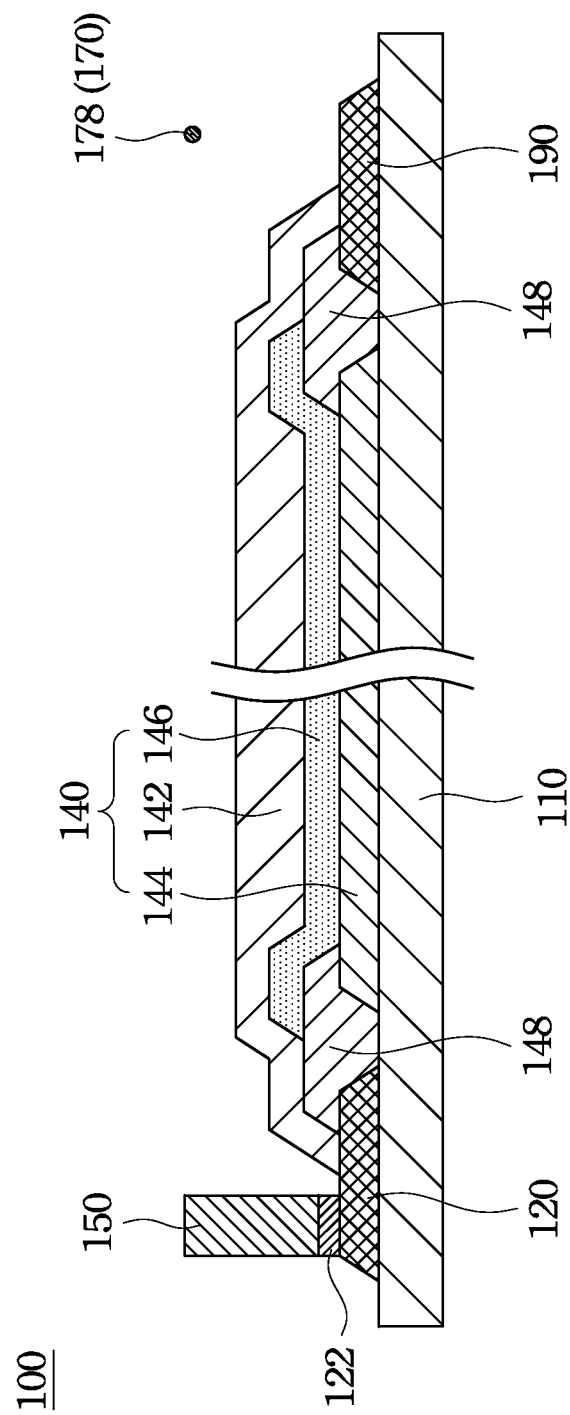
FIG. 12 is a cross-sectional view of the organic light emitting diode module taken along line 12-12 shown in FIG. 11.

FIG. 11 is a top view of an organic light emitting diode module 100 according to an embodiment of the present invention. FIG. 12 is a cross-sectional view of the organic light emitting diode module 100 taken along line 12-12 shown in FIG. 11. As shown in FIG. 11 and FIG. 12, the organic light emitting diode module 100 includes the substrate 110, the first electrode 120, the second electrodes 130, the light emitting element 140, the first copper foil 150, the second copper foils 160, the cross connection conductor 170, and the third electrode 190. The difference between this embodiment and the embodiment shown in FIG. 9 is that the cross connection conductor 170 shown in FIG. 11 and FIG. 12 is a conductive wire 178. The conductive wire 178 may be electrically connected to the second electrodes 130 by soldering.

In this embodiment, the conductive wire 178 does not contact the third electrode 190, and is suspended above the third electrode 190. However, in other embodiments, the conductive wire 178 may have an insulating surface (not shown), in which case the conductive wire 178 may contact the third electrode 190 and be fixed on the third electrode 190. Furthermore, third electrode 190 may also be located on the substrate 110, and the present invention is not limited in this regard.

Compared with a conventional organic light emitting diode module, the organic light emitting diode module of the present invention can have uniform brightness through use of only two conductive wires connected to the power supply, and the cost of the copper foils is cheaper than the cost of conventional flexible printed circuit boards, such that the material cost and the assembly cost of the organic light emitting diode module of the present invention can be reduced. Furthermore, the copper foils can be connected to the conductive wires without any connectors (e.g., by soldering), such that the thickness of the organic light emitting diode module of the present invention can be decreased. Moreover, the volume conductivity of the copper foils is larger than the volume conductivity of the conventional flexible printed circuit boards. When conducting electricity, the temperature of the copper foils is lower than the temperature of the conventional flexible printed circuit boards, such that the life span of the organic light emitting diode module of the present invention can be extended.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. An organic light emitting diode module comprising:
    a substrate;
    a first electrode located on the substrate;
    a pair of second electrodes located on the substrate and in an arrangement opposite to one another;
    a light emitting element located on the substrate and comprising:
        a first electrode layer electrically connected to the first electrode;
        a second electrode layer located between the second electrodes and electrically connected to the second electrodes; and
        an organic light emitting layer located between the first and second electrode layers;
    a first copper foil electrically connected to the first electrode;
    a pair of second copper foils respectively electrically connected to the second electrodes;
    a cross connection conductor electrically connected to the second copper foils, wherein the cross connection conductor is a third copper foil; and
    at least one conductive adhesive adhering the third copper foil and the second copper foils.

2. The organic light emitting diode module as claimed in claim 1, wherein the third copper foil and the second copper foils form a U-shaped configuration when viewed from above.

3. The organic light emitting diode module as claimed in claim 1, wherein the third copper foil and the second copper foils are formed as a single piece.

4. The organic light emitting diode module as claimed in claim 1, wherein the third copper foil comprises two opposite end portions along the length direction thereof, each of the second copper foils comprises a connecting portion adjacent to the third copper foil, and the two opposite end portions of the third copper foil respectively overlap the connecting portions of the second copper foils.

5. The organic light emitting diode module as claimed in claim 4, further comprising:
    at least one conductive adhesive adhering the two opposite end portions of the third copper foil and the connecting portions of the second copper foils.

6. The organic light emitting diode module as claimed in claim 1, wherein the cross connection conductor is a conductive wire.

7. The organic light emitting diode module as claimed in claim 1, further comprising:
    a third electrode located on the substrate and opposite to the first electrode, wherein the first electrode layer is located between the first and third electrodes, and is electrically connected to the first and third electrodes.

8. The organic light emitting diode module as claimed in claim 7, wherein the cross connection conductor is disposed above the third electrode overlapping at least a portion of the third electrode.

9. The organic light emitting diode module as claimed in claim 7, further comprising:
    an insulating layer located between the third electrode and the cross connection conductor.

10. The organic light emitting diode module as claimed in claim 1, further comprising:
    a power supply for providing a negative potential to the first copper foil and providing a positive potential to the second copper foils.

11. The organic light emitting diode module as claimed in claim 1, further comprising:
    a first conductive wire electrically connected to the first copper foil; and
    at least one second conductive wire electrically connected to at least one of the second copper foils and the cross connection conductor.

12. The organic light emitting diode module as claimed in claim 1, wherein a volume conductivity of the first copper foil is larger than $100\times10^{-6}$ Ohm·cm.

13. The organic light emitting diode module as claimed in claim 1, wherein a volume conductivity of each of the second copper foils is larger than $100\times10^{-6}$ Ohm·cm.

14. The organic light emitting diode module as claimed in claim 1, wherein the thickness of the first copper foil is smaller than 0.5 mm.

15. The organic light emitting diode module as claimed in claim 1, wherein the thickness of each of the second copper foils is smaller than 0.5 mm.

16. The organic light emitting diode module as claimed in claim 1, further comprising:
    a protection cover located on the first and the second electrodes.

17. The organic light emitting diode module as claimed in claim 16, further comprising:
    a packaging gel adhering the protection cover on the first and the second electrodes.

* * * * *